United States Patent
Nam et al.

(10) Patent No.: US 6,967,362 B2
(45) Date of Patent: Nov. 22, 2005

(54) FLEXIBLE MEMS TRANSDUCER AND MANUFACTURING METHOD THEREOF, AND FLEXIBLE MEMS WIRELESS MICROPHONE

(75) Inventors: Yun-woo Nam, Youngin (KR); Suk-han Lee, Yongin (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/669,428

(22) Filed: Sep. 25, 2003

(65) Prior Publication Data

US 2004/0061543 A1 Apr. 1, 2004

(30) Foreign Application Priority Data

Sep. 26, 2002 (KR) ............................ 10-2002-0058313

(51) Int. Cl.⁷ .................... H01L 27/20; H01L 29/84
(52) U.S. Cl. ...................... 257/254; 257/417; 257/418
(58) Field of Search .................. 257/254, 417, 257/418

(56) References Cited

U.S. PATENT DOCUMENTS 6,071,819 A    6/2000   Tai et al. .................... 438/694

*Primary Examiner*—Long Pham
(74) *Attorney, Agent, or Firm*—Lee & Morse P.C.

(57) ABSTRACT

A flexible wireless MEMS microphone includes a substrate of a flexible polymeric material, a flexible MEMS transducer structure formed on the substrate by PECVD, an antenna printed on the substrate for communicating with an outside source, a wire and interface circuit embedded in the substrate to electrically connect the flexible MEMS transducer and the antenna, a flexible battery layer electrically connected to the substrate for supplying power to the MEMS transducer, and a flexible bluetooth module layer electrically connected to the battery layer. The flexible MEMS transducer includes a flexible substrate, a membrane layer deposited on the substrate, a lower electrode layer formed on the membrane layer, an active layer formed by depositing a piezopolymer on the lower electrode layer, an upper electrode layer formed on the active layer, and a first and a second connecting pad electrically connected to the lower and upper electrode layers, respectively.

31 Claims, 8 Drawing Sheets

FLEXIBLE MEMS TRANSDUCER AND MANUFACTURING METHOD THEREOF, AND FLEXIBLE MEMS WIRELESS MICROPHONE

BACKGROUND OF THE INVENTION

1. Field of the Invention

The present invention relates to a microelectromechanical system (MEMS) structure and a method for manufacturing the same. More particularly, the present invention relates to a flexible MEMS transducer formed on a flexible substrate, a manufacturing method thereof, and a flexible MEMS wireless microphone incorporating the flexible MEMS transducer.

2. Description of the Related Art

In accordance with the need for very small devices, semiconductor processing technology using micromachining techniques is employed to integrate micro devices. The field of micro-electromechanical systems (MEMS) is a field of manufacturing and testing miniature sensors or actuators, which have sizes on the order of micrometers ($\mu$m), and electromechanical structures using micromachining technology applied in semiconductor processing, particularly, in integrated circuit technology.

The micromachining technology employed in MEMS is largely divided into two categories. The first micromachining category is bulk micromachining by silicon bulk etching. The second micromachining category is surface micromachining by depositing a film of polycrystalline silicon, silicon nitride and silicon oxide on silicon and etching the deposited film according to a predetermined pattern to form a structure. For example, the formation of an ultra small microphone manufactured using a MEMS process is achieved using a diaphragm transducer formed by the bulk micromachining technology.

FIG. 1 illustrates a cross-sectional view of a conventional MEMS transducer. As shown, the conventional transducer includes a diaphragm layer of silicon nitride, a $SiO_2$ layer coated by a chemical vapor deposition (CVD) process, a piezo film of zinc oxide (ZnO) and an upper and a lower electrode on a silicon (Si) wafer. The CVD process to form a silicon nitride thin film and a silicon oxide layer on a silicon wafer is a high temperature process requiring a process temperature of about 780 to 850° C. Therefore, it is impossible to use a flexible polymeric material other than the silicon wafer as a material for the substrate.

Meanwhile, as the information and communication industry develops, demand for a hand-held or wearable information terminal is similarly increasing. This increase in demand is due in part to the applications of such information terminals being implemented into diverse fields, such as medical, service, entertainment, military, and information communication. For convenience in using these information terminals, the components of these terminals should have excellent characteristics in terms of mobility and wearability. In particular, in order to realize a wearable system, a flexible system structure is essential. Therefore, a technology to integrate a functional structure and other electric parts together on a flexible substrate is needed.

As a flexible substrate, metallic thin films or polymeric materials are used. Polymeric materials are more suitable for use in an electronic system. Polymeric materials, however, have a low melting point in the range of 500° C. or less. Thus, when polymeric materials are subjected to a process for forming a thin film at a high temperature, the polymeric materials deteriorate. Therefore, polymeric materials are not suitable for use as a material for the substrate, such as a wafer, in a process for manufacturing MEMS, which requires a process temperature that is higher than melting points of the polymeric materials. In practice, silicon MEMS and semiconductors, which are widely used and have excellent characteristics in terms of performance and degree of integration, are generally produced by methods including a high temperature process of at least 500° C. Therefore, the substrate of a high molecular (polymeric) material, which is needed for a flexible system structure, cannot be used.

Specifically, a conventional MEMS structure is formed by depositing a thin film by chemical vapor deposition (CVD), followed by an etching process. However, since a very high temperature is needed to form a high-utility thin film by CVD, a low-melting point substrate, such as a polymer, glass, or the like, cannot be used.

In order to overcome such problems, a conventional method, as shown in FIG. 2, produces a flexible device by forming a sensor device 30 on a silicon substrate 10 using a silicon MEMS process, cutting between silicon islands from a backside of the silicon substrate 10 and then depositing a polymer 11. However, this method has disadvantages in that the conventional MEMS process, which includes a high temperature process, is used and a polymer process is additionally performed in a final step, thereby increasing the complexity and the cost of the entire manufacturing process.

SUMMARY OF THE INVENTION

Therefore, in order to solve at least some of the above-described problems, it is a feature of an embodiment of the present invention to provide a microphone, which has characteristics of softness, flexibility and foldability, by forming a MEMS transducer structure on a flexible polymer substrate using a plasma enhanced chemical vapor deposition (PECVD) process.

In order to provide a feature of the present invention, an embodiment of the present invention provides a flexible MEMS transducer including a substrate of a flexible material; a membrane layer deposited on the substrate, the membrane layer having a raised part of a predetermined length; a lower electrode layer formed by depositing an electrically conductive material on the membrane layer; an active layer formed by depositing a piezopolymer on the lower electrode layer; an upper electrode layer formed by depositing an electrically conductive material on the active layer; a first connecting pad electrically connected to the lower electrode layer; and a second connecting pad electrically connected to the upper electrode layer.

Preferably, the transducer may further include a lower protective layer formed by coating either silicon nitride and silicon oxide on the substrate to a thickness of less than about 10 $\mu$m.

Preferably, the substrate is formed of either a high-molecular (polymeric) material, such as polyimide, or a metallic thin film.

Preferably, the membrane layer is formed by depositing silicon nitride to a thickness of less than about 5 $\mu$m by PECVD.

Preferably, the lower electrode layer and the upper electrode layer are formed of a material selected from the group consisting of metals, such as aluminum, and electrically conductive polymers to a thickness of between about 0.01 $\mu$m to 5 $\mu$m.

Preferably, the active layer is formed by depositing a piezopolymer selected from the group consisting of PVDF, PVDF-TrEF, TrEF, Polyurea, polyimid and Nylon to a thickness of between about 1 μm to 10 μm and a length of between about 50 μm to 1000 μm to have a resonance frequency of between about 1 Hz to 100 kHz.

Preferably, the transducer may further include an upper protective layer formed by depositing either silicon nitride or silicon oxide to a thickness of between about 1 μm to 10 μm to cover the upper and lower electrode layers and the active layer.

Preferably, the first connecting pad and the second connecting pad are formed of a material selected from the group consisting of metals and electrically conductive polymers.

In order to provide another feature of the present invention, an embodiment of the present invention provides a method for manufacturing a flexible transducer including: forming a sacrificial layer on a flexible substrate; depositing a membrane layer on the sacrificial layer by plasma enhanced chemical vapor deposition PECVD, followed by patterning; depositing a lower electrode layer on the membrane layer, followed by patterning; sequentially depositing an active layer and an upper electrode layer on the lower electrode layer and patterning the upper electrode layer and the active layer in this order; forming a first connecting pad to be connected to the lower electrode layer and a second connecting pad to be connected to the upper electrode layer; and removing the sacrificial layer. The method may further include forming a lower protective layer by depositing either silicon nitride or silicon oxide by PECVD, before depositing the sacrificial layer.

Preferably, to form the sacrificial layer, polyimide is coated to a thickness of less than about 0 to 10 μm on the substrate and patterned by either wet etching or dry etching in accordance with a desired configuration of the membrane layer.

Preferably, to form the membrane layer, silicon nitride is deposited on the sacrificial layer by PECVD and patterned by drying etching.

Preferably, to form the active layer, a piezopolymer such as PVDF, PVDF-TrEF, TrEF, Polyurea, polyimide, Nylon and the like is deposited to a thickness of less than about 10 μm on the lower electrode layer by spincoating or evaporation and patterned by either wet etching or dry etching.

Preferably, the method may further include a step to form an upper protective layer to cover the upper and lower electrode layers and the active layer, in which the upper protective layer is formed by depositing either silicon nitride or silicon oxide to a thickness of less than about 10 μm by PECVD and patterning the deposited layer by either wet etching or dry etching.

Preferably, the first connecting pad is formed by patterning the upper protective layer at a portion to be connected to the lower electrode layer by either wet etching or dry etching; depositing a metal layer or an electrically conductive polymer layer thereon; and patterning the deposited layer by either wet etching or dry etching. Preferably, the second connecting pad is formed by patterning the upper protective layer at a portion to be connected to the upper electrode layer by either wet etching or dry etching; depositing a metal layer or an electrically conductive polymer layer thereon; and patterning the deposited layer by either wet etching or dry etching.

In order to provide yet another feature of the present invention, an embodiment of the present invention provides a flexible wireless MEMS microphone including a substrate of a flexible polymeric material; a flexible MEMS transducer structure formed on the substrate by plasma enhanced chemical vapor deposition (PECVD); an antenna printed on the substrate for communicating with an outside source; a wire and interface circuit embedded in the substrate to electrically connect the flexible MEMS transducer and the antenna; a flexible battery layer electrically connected to the substrate for supplying power to the MEMS transducer; and a flexible bluetooth module layer electrically connected to the battery layer.

Preferably, the substrate is formed of a high-molecular (polymeric) material, such as polyimide. Preferably, the battery layer is a polymer battery, such as a flexible solar cell, having a paper-like thinness. Preferably, the flexible MEMS transducer includes a membrane layer, a lower electrode layer, a piezopolymeric active layer, an upper electrode layer and a first and a second connecting pad connected to the lower electrode layer and the upper electrode layer, respectively, which are sequentially deposited by plasma enhanced chemical vapor deposition (PECVD) and patterned on the substrate having a sacrificial layer formed thereon.

Preferably, the flexible substrate, on which the flexible MEMS transducer is formed, the antenna is printed, and the wire and interface circuit are embedded, is able to be folded at a predetermined angle, such as a predetermined angle in the range of less than about 180°.

In order to provide still another feature of the present invention, an embodiment of the present invention provides a flexible MEMS wireless microphone including a flexible substrate, which has a flexible MEMS transducer structure formed by plasma enhanced chemical vapor deposition (PECVD), an antenna printed thereon to be electrically connected to the MEMS transducer structure and for communicating with an outside source and a wire and interface circuit embedded therein for electrically connecting the flexible MEMS transducer and antenna; a flexible battery layer electrically connected to the flexible substrate; and a bluetooth module layer, which are sequentially deposited to a predetermined thickness.

Preferably, the flexible MEMS wireless microphone is able to be folded at a predetermined angle, such as a predetermined angle in the range of less than about 180°. Preferably, the flexible wireless MEMS microphone is formed into a desired three-dimensional structure by cutting in accordance with a side shape of the desired three-dimensional structure and folding the cut piece at a predetermined angle, followed by assembling into the three-dimensional structure.

In order to provide a further feature of the present invention, an embodiment of the present invention provides a method for manufacturing a flexible transducer including: forming a sacrificial layer on a flexible substrate, sequentially depositing on the sacrificial layer by a plasma enhanced chemical vapor deposition (PECVD) process, a membrane layer, a lower electrode layer, an active layer and an upper electrode layer, sequentially patterning the upper electrode layer, the active layer and the lower electrode layer, depositing an upper protective layer to cover the upper electrode layer, the lower electrode layer and the active layer, patterning the upper protective layer for a connection of the lower electrode layer and of the upper electrode layer, depositing a connecting pad layer, and patterning the connecting pad layer to form a first connecting pad to be connected with the lower electrode layer and a second connecting pad to be connected with a connection part of the upper electrode layer, and patterning the membrane layer to expose the sacrificial layer and removing the sacrificial layer.

The method may further include forming a lower protective layer by depositing one of a material selected from the group consisting of silicon nitride and silicon oxide on the flexible substrate by a method selected from PECVD and sputtering, prior to the deposition of the sacrificial layer.

Preferably, the sacrificial layer has a thickness of less than about 10 μm. Preferably, the membrane layer is formed by depositing a silicon nitride. Preferably, the active layer is formed to a thickness of less than about 10 μm by depositing a piezopolymer layer on the lower electrode layer by either spin coating or evaporation, wherein the piezopolymer may be PVDF, PVDF-TrEF, TrEF, Polyurea, polyimide or Nylon. Preferably, the upper protective layer is formed to a thickness of less than about 10 μm.

BRIEF DESCRIPTION OF THE DRAWINGS

The above and other features and advantages of the present invention will become more apparent to those of ordinary skill in the art by describing in detail preferred embodiments thereof with reference to the attached drawings, in which.

DETAILED DESCRIPTION OF THE INVENTION

Figure 1:
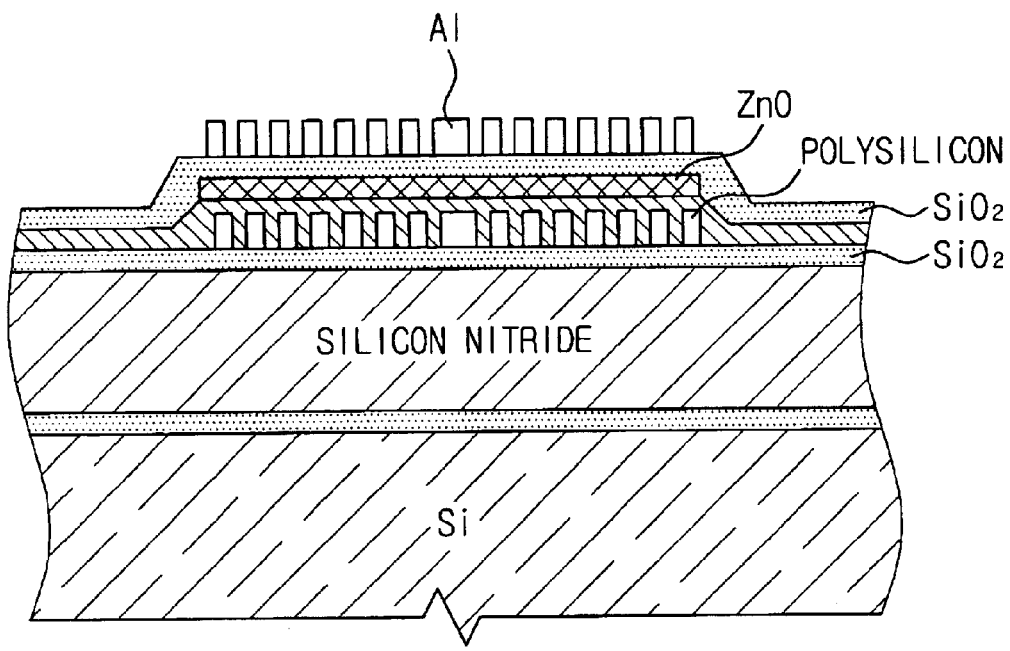
FIG. 1 illustrates a cross-sectional view of a conventional MEMS transducer.
Figure 2:
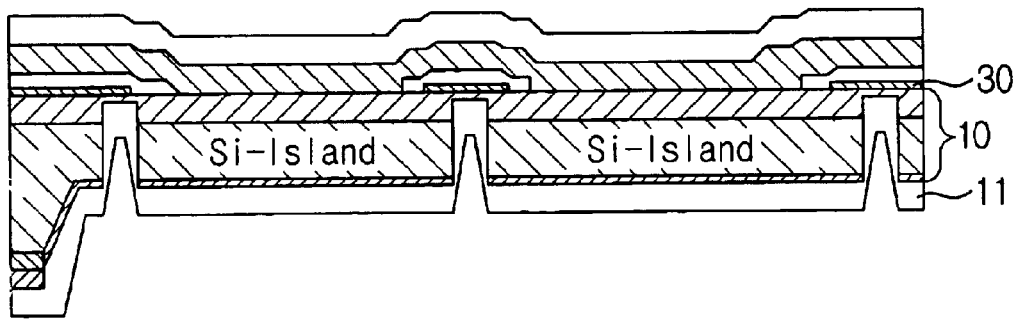
FIG. 2 illustrates a cross-sectional view of a conventional flexible MEMS sensor.

Korean Patent Application No. 2002-58313, filed on Sep. 26, 2002, and entitled: "Flexible MEMS Transducer and its Manufacturing Method, and Flexible MEMS Wireless Microphone," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3:
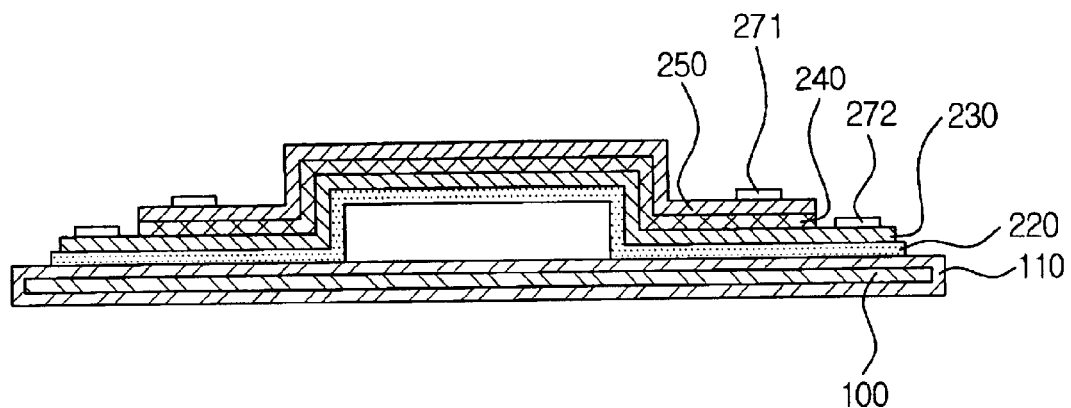
FIG. 3 illustrates a cross-sectional view of a diaphragm-type transducer according to an embodiment of the present invention.
Figure 4:
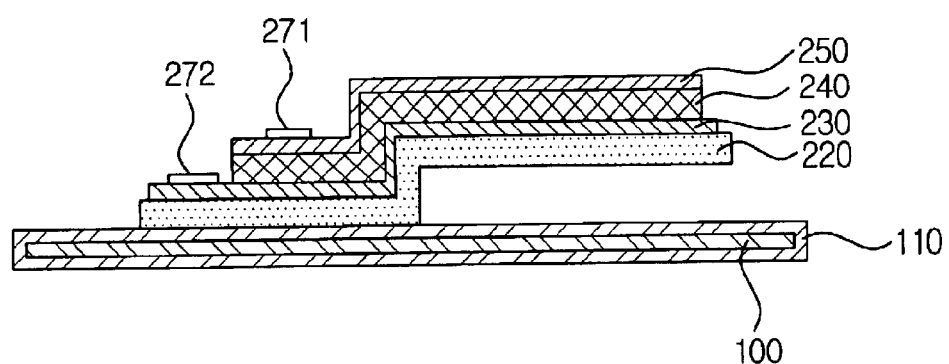
FIG. 4 illustrates a cross-sectional view of a cantilever-type transducer according to an embodiment of the present invention.

FIG. 3 illustrates a cross-sectional view of a diaphragm-type transducer according to an embodiment of the present invention. FIG. 4 illustrates a cross-sectional view of a cantilever-type transducer according to an embodiment of the present invention. As shown in FIGS. 3 and 4, a transducer according to an embodiment of the present invention includes a flexible substrate 100, on which a lower protective layer 110 has been formed by depositing either silicon nitride or silicon oxide by plasma enhanced chemical vapor deposition (PECVD) or by sputtering, and a transducer structure including a membrane layer 220 formed by PECVD, which is performed at a low temperature, a lower electrode layer 230, an active layer 240, which is preferably a piezopolymer layer, an upper electrode layer 250 and connecting pads 271 and 272. In the case of a diaphragm-type or a cantilever-type transducer, a sacrificial layer is formed on the substrate 100, the membrane layer 220 is formed thereon, and then the sacrificial layer is removed by an etchant in order to form a raised part of the membrane layer 220. More specifically, in the case of a cantilever-type transducer, the removal of the sacrificial layer under the membrane layer is performed by removing the sacrificial layer through an open side, and in the case of a diaphragm-type transducer, the removal is performed by forming predetermined through holes on the membrane layer 220 by etching and injecting an etchant through the through holes.

FIGS. 5A to 5E sequentially illustrate stages in an embodiment of a process for manufacturing the cantilever-type flexible transducer according to the present invention. The exemplary transducer shown in the figures is a cantilever-type, and an exemplary process for manufacturing a cantilever-type transducer will now be explained with reference to FIGS. 5A to 5E.

Figure 5A:
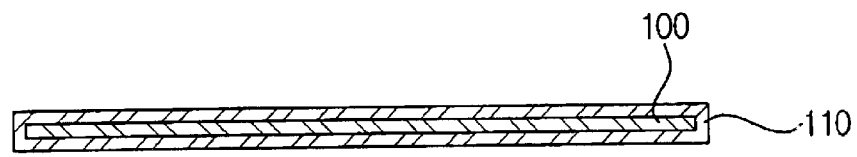
FIGS. 5A to 5E illustrate cross-sectional views of stages in a process for manufacturing the cantilever-type transducer shown in FIG. 4.

As shown in FIG. 5A, the manufacturing process of the flexible transducer starts with coating a lower protective layer 110 on a flexible substrate 100. As a material for the flexible substrate 100, a flexible material is used. This flexible material may include a high-molecular (polymeric) material, such as polyimide or a metallic thin film. A high-molecular material is the preferred material for use in an electronic system, such as a microphone. The lower protective layer 110 is formed by coating silicon nitride or silicon oxide by PECVD or sputtering. Preferably, the lower protective layer 110 has a thickness of less than about 10 μm. By using the PECVD or sputtering process, it is possible to perform the process at a low-temperature process of about 400° C. or less. The lower protective layer 110 functions to protect the substrate 100 and to facilitate the adhesion of layers, which will be subsequently deposited.

Figure 5B:
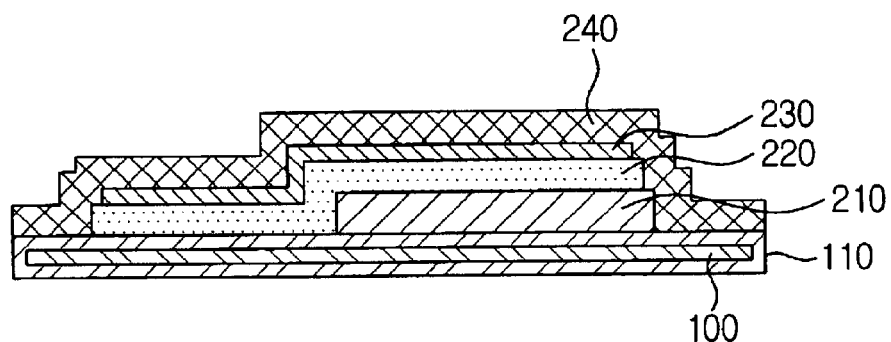

As shown in FIG. 5B, on the flexible substrate 100 on which the lower protective layer 110 is coated, a sacrificial layer 210 is deposited which will be used to form a membrane layer having a raised part of a predetermined length. The sacrificial layer 210 is formed by coating a polyimide to a thickness of less than about 10 μm and then patterning the polyimide in accordance with a desired configuration of the membrane layer. A membrane layer 220 is then deposited on the patterned sacrificial layer 210. The membrane layer 220 is formed by coating silicon nitride by PECVD in a low temperature process. Preferably, the membrane layer 220 has a thickness of less than about 5 μm. Next, a lower electrode 230 is deposited on the membrane layer 220. The lower electrode layer 230 is formed by depositing a metal, such as aluminum or an electrically conductive polymer, and then patterning the deposited layer by either wet etching or dry etching. An active layer 240 is then coated on the lower electrode layer 230 and the membrane layer 220. The active layer 240 is formed by coating a piezopolymer, such as PVDF, PVDF-TrEF, TrEF, Polyurea, polyimide, Nylon or the like, by spin coating or evaporation. Preferably, the active layer 240 has a thickness of between about 1 μm to 10 μm and a length of between about 50 μm to 1000 μm. Preferably, the active layer 240 has a resonance frequency of between about 1 Hz to 100 kHz.

Figure 5C:
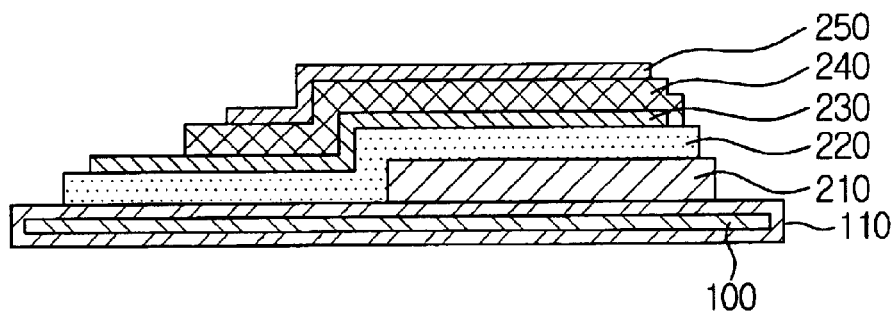

As shown in FIG. 5C, an upper electrode 250 is then deposited on the piezopolymer active layer 240. The upper electrode layer 250 is formed by depositing a metal, such as aluminum or an electrically conductive polymer, and patterning the deposited layer by either wet etching or dry etching. Preferably, each of the lower electrode layer 230 and the upper electrode layer 250 has a thickness of between about 0.01 μm to 5 μm. At this time, the piezopolymer layer is also patterned by either wet etching or dry etching to form the active layer 240.

Figure 5D:
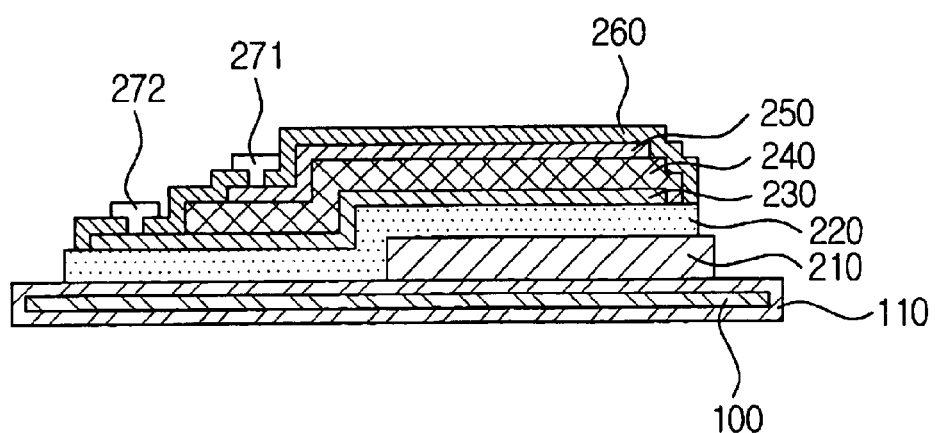

Next, as shown in FIG. 5D, an upper protective layer 260 is formed by depositing silicon nitride or silicon oxide to a thickness of between about 1 μm to 10 μm by PECVD to cover the upper and lower electrode layers 230 and 250 and the active layer 240 so that the piezopolymer active layer 240 is protected during the removal of the sacrificial layer 210 by etching. After forming the upper protective layer 260, connecting pads 271, 272 are formed to be electrically connected to the upper electrode layer 250 and the lower electrode layer 230, respectively. The connecting pads 271 and 272 are formed by patterning the upper protective layer 260 at portions to be connected to the upper and lower electrode layers 250 and 230, respectively and by coating a metal, such as aluminum or an electrically conductive polymer, thereon, and then patterning.

Figure 5E:
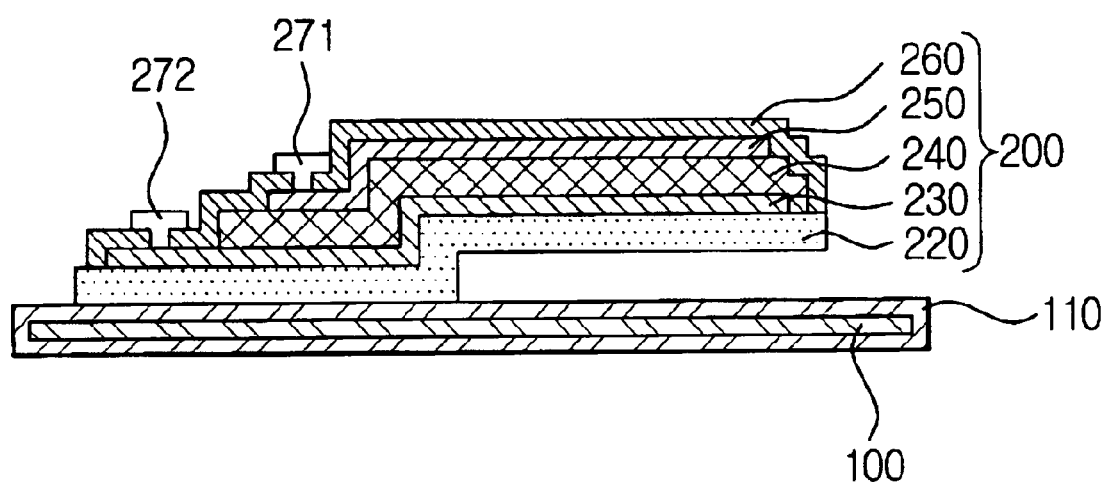

Finally, as shown in FIG. 5E, the sacrificial layer 210 is removed by dry etching and the formation of the flexible cantilever-type MEMS transducer is completed.

FIGS. 6A to 6J illustrate sectional views of stages in a process for manufacturing a cantilever-type transducer according to another embodiment of the present invention.

Figure 6A:
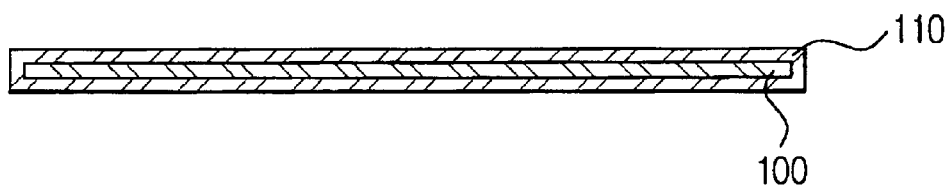
FIGS. 6A to 6J illustrate sectional views of stages in a process for manufacturing a cantilever-type transducer according to another embodiment of the present invention.
Figure 6B:
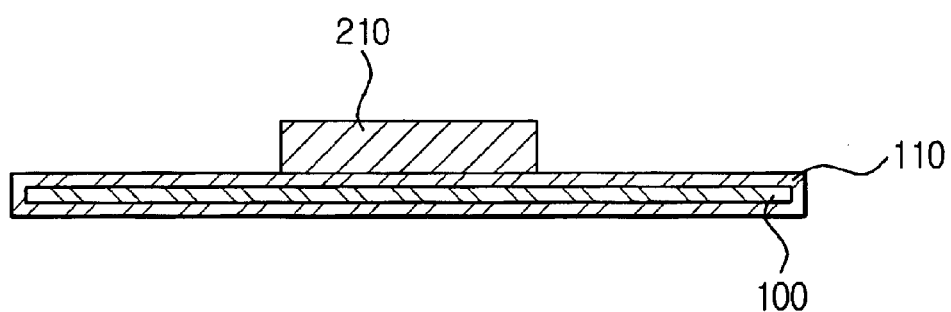

As shown in FIG. 6A, a lower protective layer 110 is formed by depositing a silicon nitride or silicon oxide on a flexible substrate 100 by plasma enhanced chemical vapor deposition (PECVD) or by sputtering. Next, as shown in FIG. 6B, a sacrificial layer 210 is formed by depositing a polyimide to a thickness of less than about 10 μm and then patterning the polyimide.

Figure 6C:
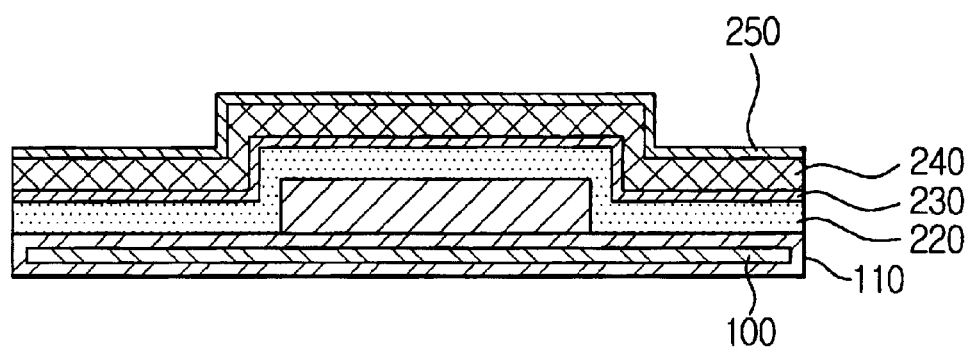
Figure 6D:
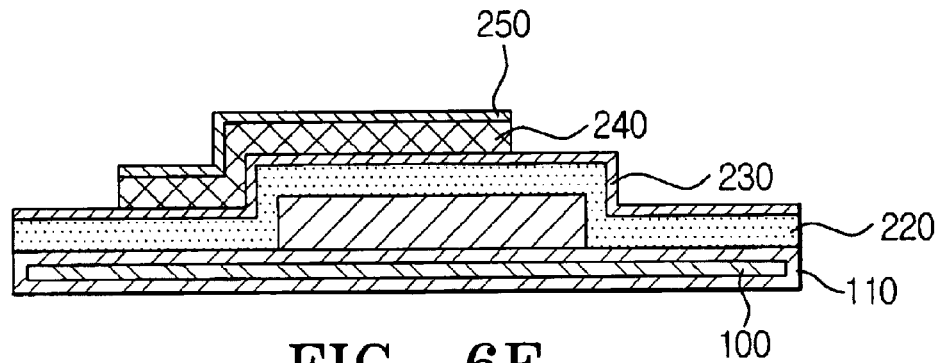
Figure 6E:
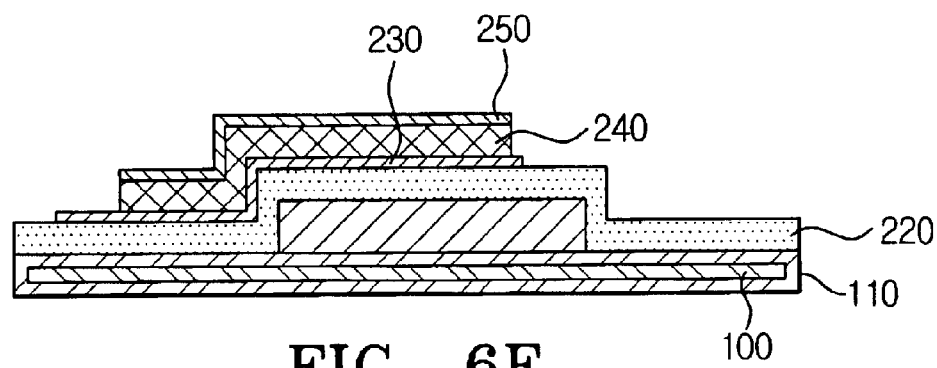

After the sacrificial layer 210 is formed, as shown in FIG. 6C, a membrane layer 220, a lower electrode layer 230, an active layer 240 and an upper electrode layer 250 are sequentially deposited on the sacrificial layer 210 by PECVD. Next, as shown in FIG. 6D, the upper electrode layer 250 and the active layer 240 are patterned, and as shown in FIG. 6E, the lower electrode layer 230 is patterned.

Figure 6F:
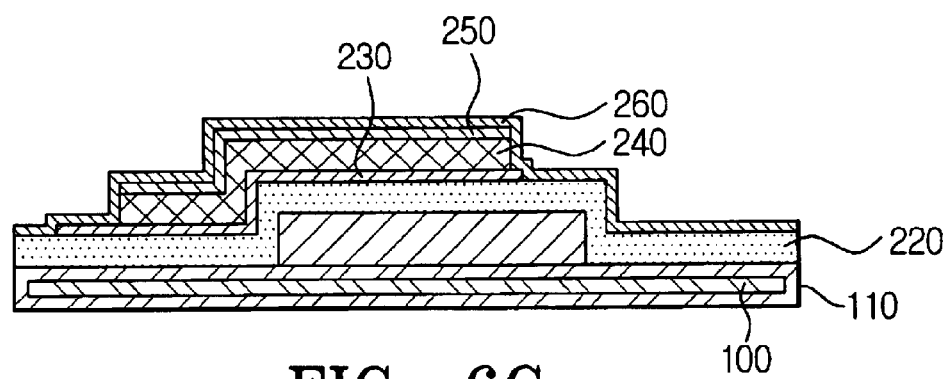
Figure 6G:
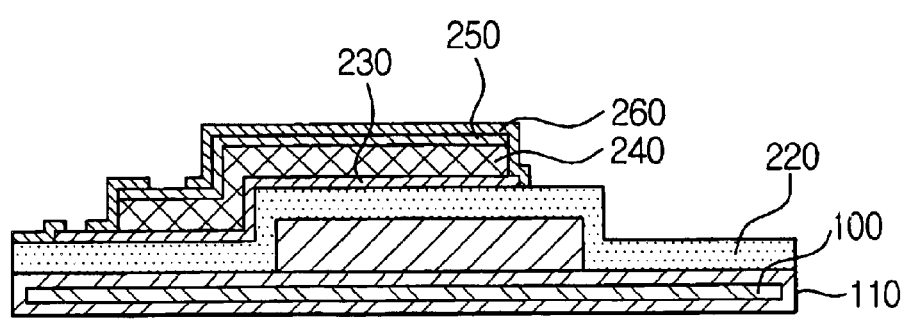
Figure 6H:
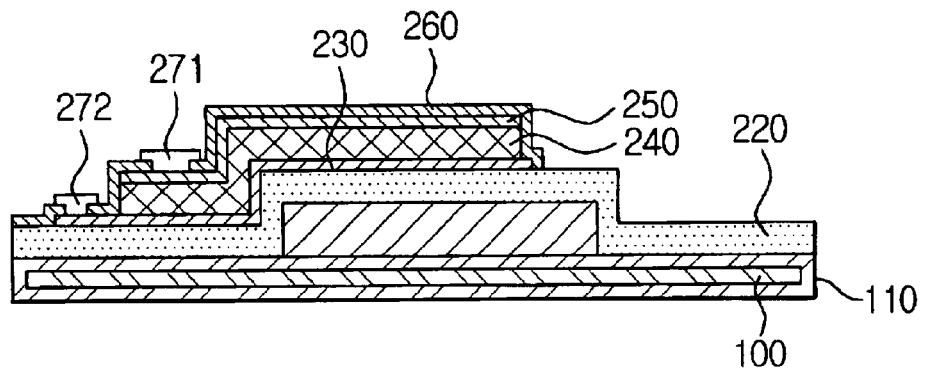
Figure 6I:
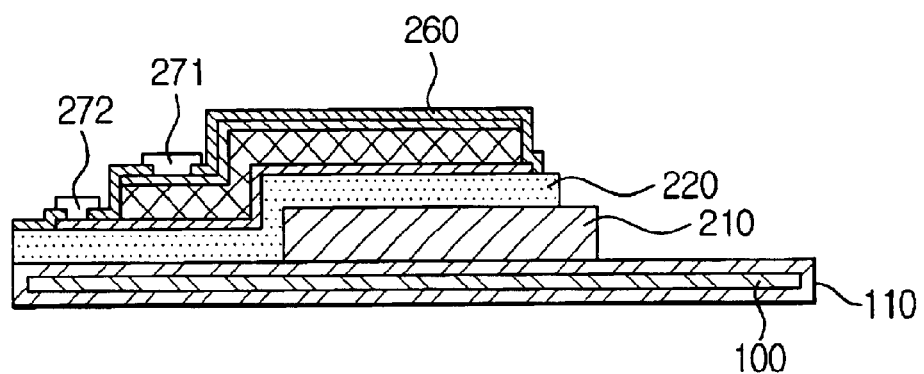
Figure 6J:
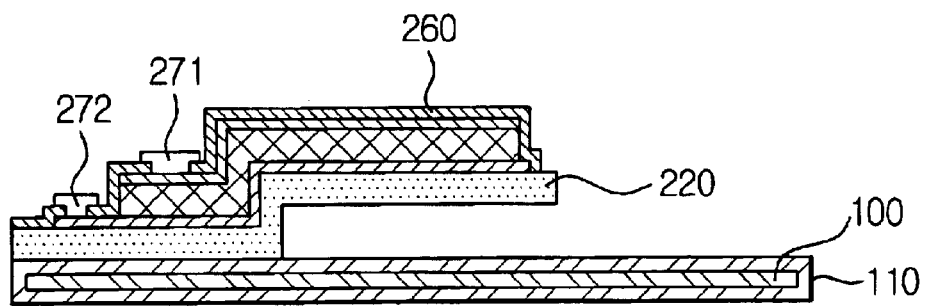

Subsequently, as shown in FIG. 6F, an upper protective layer 260 is deposited to cover the upper electrode layer 250, the lower electrode layer 230 and the active layer 240. After the deposition of the upper protective layer 260, as shown in FIG. 6G, the upper protective layer 260 is patterned for an electrical connection of the lower electrode layer 230 and also of the upper electrode layer 250. A metal layer or an electrically conductive layer is deposited on the patterned upper protective layer 260, and patterned to form a first connecting pad 272 for connecting with the lower electrode layer 230 and a second connecting pad 271 for connecting with the connecting part of the upper electrode layer 250. Next, as shown in FIG. 6I, the membrane layer 220 is patterned to expose the sacrificial layer 210, and an etchant is injected to remove the sacrificial layer 210. As a result, a flexible MEMS transducer is completed.

As for the method for manufacturing the flexible MEMS transducers, as shown in FIGS. 5A to 5E, the layers of the flexible MEMS transducer structure may be deposited and patterned respectively, or as shown in FIGS. 6A to 6J, the layers may be deposited first and then patterned, respectively.

According to the above-described manufacturing method, it is possible to form a transducer structure 200 on a flexible substrate 100, such as a polymer, by using a low-temperature process, such as PECVD. Thus, in the transducer structure 200 according to an embodiment of the present invention, the deposition of thin layers is performed by using PECVD or sputtering instead of CVD, which requires a high temperature process of about 780° C. to 850° C. The reason for this difference in required temperature levels is related to the energy source used in the respective processes. Specifically, the PECVD process uses plasma as an energy source needed for reaction, whereas the conventional CVD process uses heat energy. Therefore, the heat energy can be reduced and thin layers can be formed at a low temperature in PECVD. More particularly, it is possible to deposit thin layers constituting the transducer structure 200 at a low temperature and thereby permitting use a flexible polymeric substrate 100. Consequently, according to the present invention, a flexible microphone of soft material can be manufacture.

Figure 7:
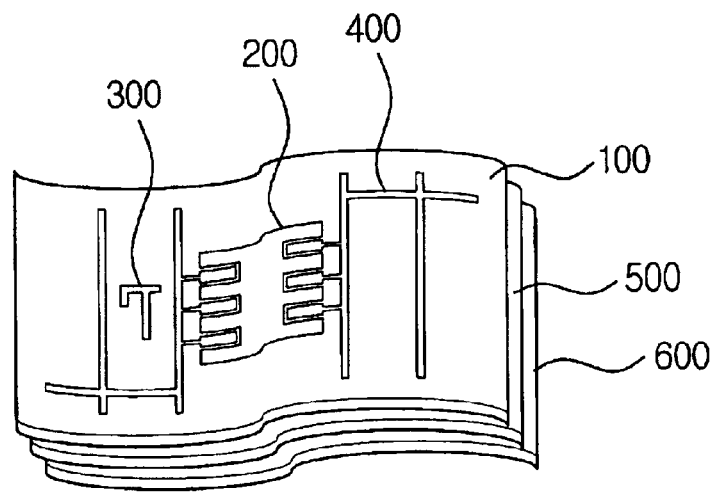
FIG. 7 illustrates a schematic view of a skin-type flexible wireless MEMS microphone incorporating the cantilever-type transducer shown in FIG. 4.

Application of the present invention further provides a freely flexible microphone incorporating a flexible MEMS transducer according to an embodiment of the present invention. FIG. 7 illustrates a schematic view of a skin-type flexible wireless MEMS microphone incorporating the cantilever-type transducer shown in FIG. 4. As shown in FIG. 7, the flexible microphone using the flexible MEMS transducer is prepared by forming an MEMS transducer structure 200 by PECVD on a flexible substrate, as described above, printing a film antenna 300 at a side of the substrate 100 for communicating with an outside source and embedding a wire and interface circuit 400 to electrically connect the film antenna 300 and the flexible MEMS transducer 200. The resulting substrate 100 is laminated together with a battery layer 500 electrically connected to the flexible substrate 100 for supplying power to the MEMS transducer 200 and a flexible bluetooth module layer 600. Preferably, the battery layer 500 is a polymer batter, such as a flexible polymer solar cell and has a paper-like thinness.

Thus, the flexible MEMS microphone prepared by laminating the substrate 100 having the transducer 200 formed with the battery layer 500 and the flexible bluetooth module layer 600 to a predetermined thickness can be used as a skin-type flexible MEMS microphone. Such a skin-type flexible MEMS microphone is freely flexible in all directions and can be used in a wearable device.

Figure 8:
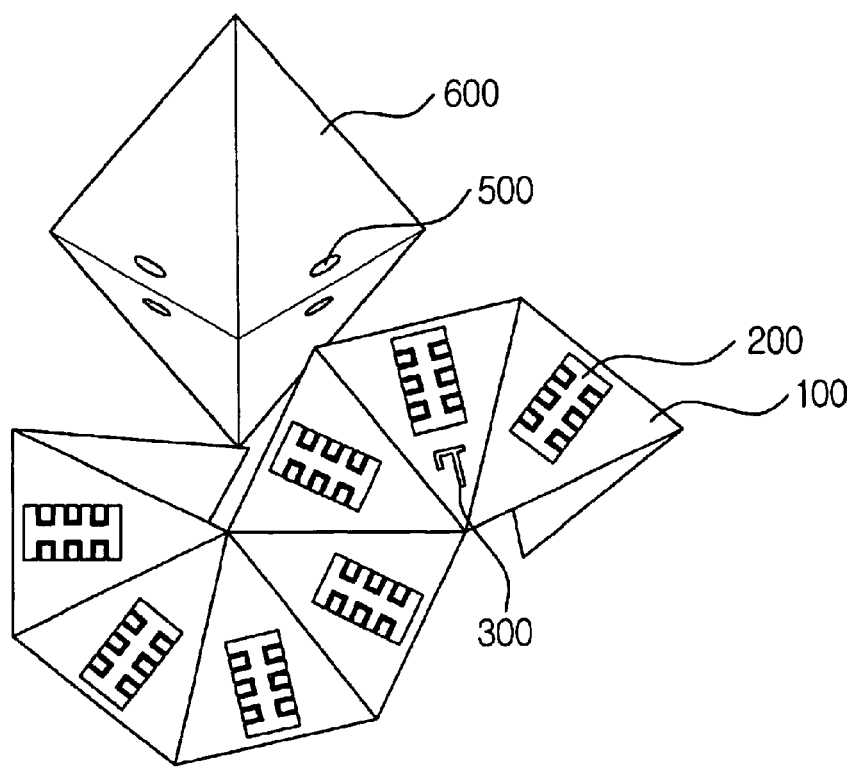
FIG. 8 illustrates a schematic view of a three-dimensional wireless microphone packaging incorporating the cantilever-type transducer shown in FIG. 4.

In addition, the flexible wireless microphone according to the present invention can be packaged into a three-dimensional shape since the flexible substrate 100 can be folded at a predetermined angle. Preferably, the predetermined angle is in the range of less than about 180°. FIG. 8 illustrates a schematic view of an example of a packaged flexible wireless microphone. As shown in FIG. 8, a flexible MEMS transducer structure 200 is formed on a flexible substrate 100. An antenna 300 is printed on the flexible substrate 100 and a wire and interface circuit 400 is embedded in the flexible substrate 100. The flexible substrate 100 is then cut in accordance with a development figure of a desired three-dimensional shape of a microphone packaging, folded at a predetermined angle and assembled into the desired three-dimensional shape to form a three-dimensional microphone.

Since the substrate 100 on which the flexible MEMS transducer is formed has paper-like features, it can be cut and folded in accordance with a desired three-dimensional structure of the microphone to be packaged and assembled into the desired three-dimensional structure for packaging.

The skin-type microphone including the battery layer 500 and the bluetooth module layer 600 laminated on the substrate 100, as shown in FIG. 7, can be cut and folded altogether and assembled into a three-dimensional structure to form a three-dimensional wireless MEMS microphone. Alternatively, as shown in FIG. 8, the flexible battery layer 500 and the flexible bluetooth module layer 600 are assembled into a three-dimensional structure. Separately, the substrate provided with the transducer structure 200, antenna 300 and wire and interface circuit 400 thereon is cut in accordance with a development figure of a desired three-dimensional shape, folded at a predetermined angle and assembled with the three-dimensional structure of the flexible battery layer 500 and the bluetooth module layer 600 to form a three-dimensional MEMS microphone. The flexible MEMS wireless microphone is able to be folded at a predetermined angle, preferably in the range of less than about 180°.

More particularly, a microphone structure according to an embodiment of the present invention is flexible and foldable due to the use of a flexible polymeric substrate. Accordingly, it is possible to package the microphone into a desired three-dimensional structure by cutting and folding the substrate laminated with other elements in accordance with the desired three-dimensional structure and assembling it into a three-dimensional microphone.

As described above, according to the present invention, since a transducer structure can be prepared by a low-temperature process, a flexible polymer substrate can be used. Thus, it is possible to produce a flexible microphone system having excellent characteristics in terms of degree of integration, mobility, softness, flexibility, foldability and wearability by a simple process at a low temperature and at a reduced cost. Moreover, it is possible to package a skin-type microphone with a desired thickness that can be attached to the body and a three-dimensional microphone due to the flexibility and foldability thereof. Accordingly, various shapes of a packaging structure can be freely designed. Further, the microphone thus-obtained is easy to wear and free to change a shape thereof as needed.

In addition, since the flexible microphone according to an embodiment of the present invention can be freely prepared in various shapes suitable for application, it can be used as a skin-type microphone and also applied in a flexible MEMS transducer which can be packaged in a desired shape and a method for manufacturing such a flexible MEMS transducer.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flexible MEMS transducer, comprising
a substrate of a flexible material;
a membrane layer deposited on the substrate, the membrane layer having a raised part of a predetermined length;
a lower electrode layer formed by depositing an electrically conductive material on the membrane layer;
an active layer formed by depositing a piezopolymer on the lower electrode layer;
an upper electrode layer formed by depositing an electrically conductive material on the active layer;
a first connecting pad electrically connected to the lower electrode layer; and
a second connecting pad electrically connected to the upper electrode layer.

2. The flexible MEMS transducer as claimed in claim 1, further comprising a lower protective layer coated on the substrate.

3. The flexible MEMS transducer as claimed in claim 2, the lower protective layer is formed of either silicon nitride or silicon oxide.

4. The flexible MEMS transducer as claimed in claim 2, wherein the lower protective layer has a thickness of less than about 10 µm.

5. The flexible MEMS transducer as claimed in claim 1, wherein the substrate is formed of either a high-molecular (polymeric) material or a metallic thin film.

6. The flexible MEMS transducer as claimed in claim 5, wherein the high-molecular (polymeric) material is polyimide.

7. The flexible MEMS transducer as claimed in claim 1, wherein the membrane layer is formed of silicon nitride.

8. The flexible MEMS transducer as claimed in claim 1, wherein the membrane layer has a thickness of less than about 5 µm.

9. The flexible MEMS transducer as claimed in claim 1, wherein the lower electrode layer and the upper electrode layer are formed of a material selected from the group consisting of metals and electrically conductive polymers.

10. The flexible MEMS transducer as claimed in claim 9, wherein the metal is aluminum.

11. The flexible MEMS transducer as claimed in claim 1, wherein the lower electrode layer has a thickness of between about 0.01 µm to 5 µm.

12. The flexible MEMS transducer as claimed in claim 1, wherein the upper electrode layer has a thickness of between about 0.01 µm to 5 µm.

13. The flexible MEMS transducer as claimed in claim 1, wherein the piezopolymer is selected from the group consisting of PVDF, PVDF-TrEF, TrEF, Polyurea, polyimide and Nylon.

14. The flexible MEMS transducer as claimed in claim 1, wherein the active layer has a thickness of between about 1 µm to 10 µm.

15. The flexible MEMS transducer as claimed in claim 1, wherein the active layer has a resonance frequency of between about 1 Hz to 100 kHz.

16. The flexible MEMS transducer as claimed in claim 1, wherein the active layer has a length of between about 50 µm to 1000 µm.

17. The flexible MEMS transducer as claimed in claim 1, further comprising an upper protective layer to cover the upper and lower electrode layers and the active layer.

18. The flexible MEMS transducer as claimed in claim 17, wherein the upper protective layer is formed of either silicon nitride or silicon oxide.

19. The flexible MEMS transducer as claimed in claim 1, wherein the upper protective layer has a thickness of between about 1 µm to 10 µm.

20. The flexible MEMS transducer as claimed in claim 1, wherein the first connecting pad and the second connecting pad are formed of a material selected from the group consisting of metals and electrically conductive polymers.

21. A flexible wireless MEMS microphone including the flexible MEMS transducer as claimed in claim 1, and further comprising:
- an antenna printed on the substrate for communicating with an outside source;
- a wire and interface circuit embedded in the substrate to electrically connect the flexible MEMS transducer and the antenna;
- a flexible battery layer electrically connected to the substrate for supplying power to the flexible MEMS transducer; and
- a flexible bluetooth module layer electrically connected to the battery layer.

22. The flexible wireless MEMS microphone as claimed in claim 21, wherein the substrate is formed of a high-molecular (polymeric) material.

23. The flexible wireless MEMS microphone as claimed in claim 22, wherein the high-molecular (polymeric) material is polyimide.

24. The flexible wireless MEMS microphone as claimed in claim 21, wherein the battery layer is a polymer battery having a paper-like thinness.

25. The flexible wireless MEMS microphone as claimed in claim 21, wherein the battery layer is a flexible solar cell.

26. The flexible wireless MEMS microphone as claimed in claim 21, wherein the flexible substrate, on which the flexible MEMS transducer is formed, the antenna is printed, and the wire and interface circuit are embedded, is able to be folded at a predetermined angle.

27. The flexible wireless MEMS microphone as claimed in claim 26, wherein the predetermined angle is in the range of less than about 180°.

28. A flexible MEMS wireless microphone including the flexible MEMS transducer as claimed in claim 1, and further comprising:
- an antenna printed on the substrate to be electrically connected to the flexible MEMS transducer and for communicating with an outside source and a wire and interface circuit embedded in the substrate for electrically connecting the flexible MEMS transducer and antenna;
- a flexible battery layer electrically connected to the substrate; and
- a bluetooth module layer, which are sequentially deposited to a predetermined thickness.

29. The flexible wireless MEMS microphone as claimed in claim 28, wherein the flexible MEMS wireless microphone is able to be folded at a predetermined angle.

30. The flexible wireless MEMS microphone as claimed in claim 28, wherein the predetermined angle is in the range of less than about 180°.

31. The flexible wireless MEMS microphone as claimed in claim 28, wherein the flexible wireless MEMS microphone is formed into a desired three-dimensional structure by cutting in accordance with a side shape of the desired three-dimensional structure and folding the cut piece at a predetermined angle, followed by assembling into the three-dimensional structure.

* * * * *